(12) United States Patent
Nakaki

(10) Patent No.: US 10,199,511 B1
(45) Date of Patent: Feb. 5, 2019

(54) SEMICONDUCTOR MEMORY DEVICE

(71) Applicant: TOSHIBA MEMORY CORPORATION, Tokyo (JP)

(72) Inventor: Hiroshi Nakaki, Yokkaichi Mie (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/909,451

(22) Filed: Mar. 1, 2018

(30) Foreign Application Priority Data

Sep. 8, 2017 (JP) .................. 2017-173256

(51) Int. Cl.

| | |
|---|---|
| *H01L 27/11573* | (2017.01) |
| *H01L 27/11582* | (2017.01) |
| *H01L 29/792* | (2006.01) |
| *H01L 29/66* | (2006.01) |

(52) U.S. Cl.
CPC ...... *H01L 29/792* (2013.01); *H01L 27/11573* (2013.01); *H01L 27/11582* (2013.01); *H01L 29/66833* (2013.01)

(58) Field of Classification Search
CPC ......... H01L 29/66795; H01L 29/66833; H01L 29/792; H01L 27/11573; H01L 27/11582
See application file for complete search history.

(56) References Cited

U.S. PATENT DOCUMENTS

| | | | |
|---|---|---|---|
| 8,203,884 B2 | 6/2012 | Kito et al. | |
| 2018/0226424 A1* | 8/2018 | Shin .................. | H01L 27/11582 |

FOREIGN PATENT DOCUMENTS

JP      2011023687 A      2/2011

\* cited by examiner

*Primary Examiner* — Marc Armand
(74) *Attorney, Agent, or Firm* — Patterson & Sheridan, LLP

(57) ABSTRACT

A semiconductor memory device includes a semiconductor substrate, a stacked body including a plurality of electrode films stacked on the substrate and spaced from each other in a first direction, an end portion in a second direction has a staircase shape, a conductive member adjacent to the stacked body and connected to the semiconductor substrate, a first semiconductor pillar connected to the substrate and extending through a central portion of the stacked body, a second semiconductor pillar connected to the substrate and extending through the end portion of the stacked body, a charge storage member between the first semiconductor pillar and the electrode films, an insulating member between the second semiconductor pillar and an electrode film in the end portion of the stacked body, and an insulating layer between the semiconductor substrate and the second portion of the stacked body.

20 Claims, 8 Drawing Sheets

SEMICONDUCTOR MEMORY DEVICE

CROSS-REFERENCE TO RELATED APPLICATION

This application is based upon and claims the benefit of priority from Japanese Patent Application No. 2017-173256, filed Sep. 8, 2017, the entire contents of which are incorporated herein by reference.

FIELD

Embodiments described herein relate generally to a semiconductor memory device.

BACKGROUND

In recent years, a stacked semiconductor memory device has been proposed in which memory cells are integrated in a three-dimensional manner. In such a stacked semiconductor memory device, electrode films and insulating films are alternately stacked on a semiconductor substrate as a stacked body, and semiconductor pillars penetrate through this stacked body. Memory cell transistors are formed at intersections between the electrode films and the semiconductor pillars. In such a stacked semiconductor memory device, there is a problem in ensuring reliability.

DETAILED DESCRIPTION

In general, according to one embodiment, a semiconductor memory includes a semiconductor substrate and a stacked body including a plurality of electrode films stacked on the semiconductor substrate and spaced from one another in a first direction. An end portion of the stacked body in a second direction intersecting the first direction has a staircase shape. A conductive member extends in the first direction and is adjacent to the stacked body in the second direction. The conductive member is connected to the semiconductor substrate. A first semiconductor pillar is connected to the semiconductor substrate and extends in the first direction through a central portion of the stacked body adjacent to the end portion in the second direction. A second semiconductor pillar is connected to the semiconductor substrate and extends in the first direction through the end portion of the stacked body. A charge storage member is between the first semiconductor pillar and the electrode films. An insulating member is between the second semiconductor pillar and at least one electrode film in the end portion of the stacked body. An insulating layer is between the semiconductor substrate and the end portion of the stacked body and extends into a region of the end portion between the conductive member and the second semiconductor pillar.

First Embodiment

Figure 1:
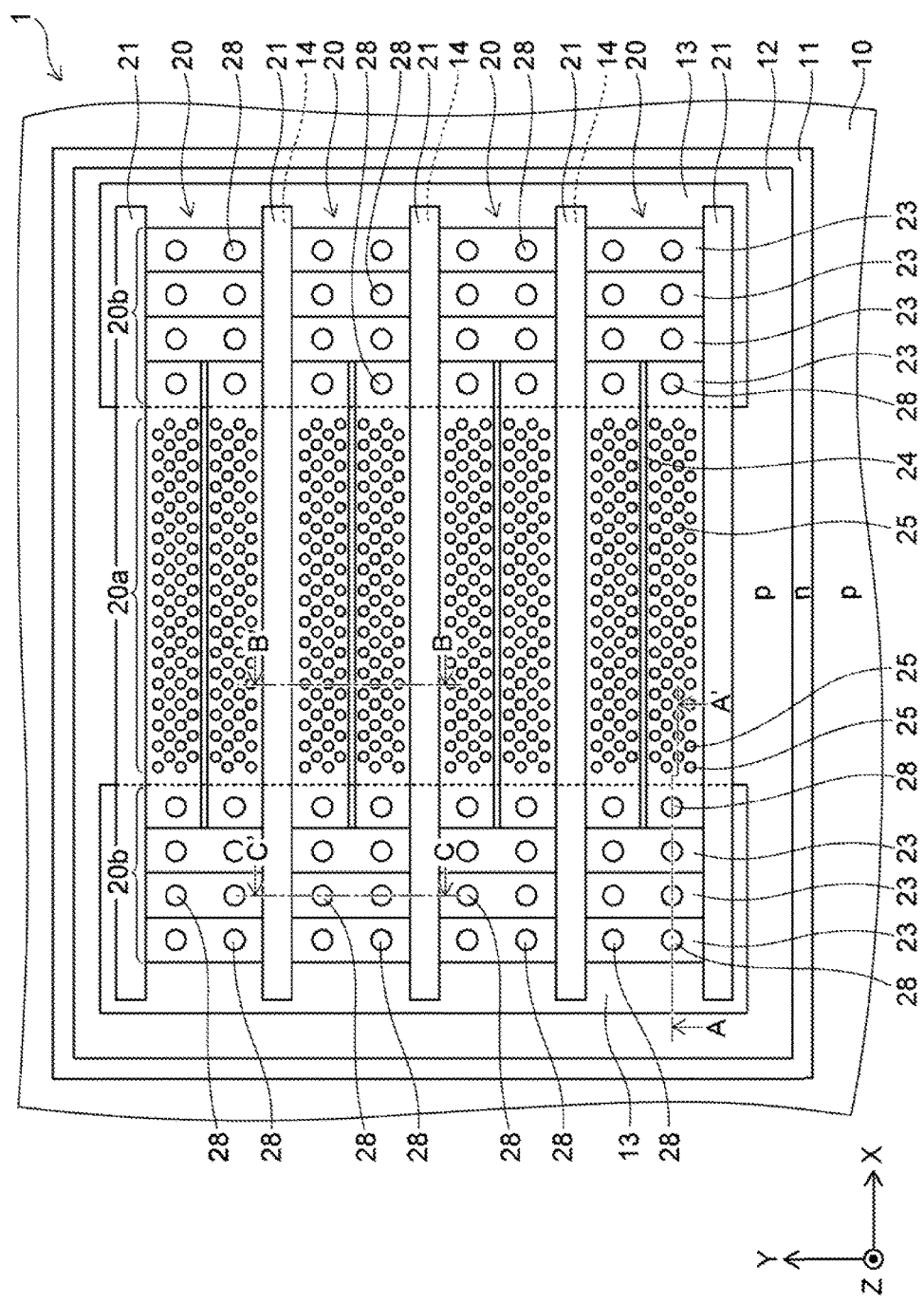
FIG. 1 is a plan view illustrating a semiconductor memory device according to a first embodiment.
Figure 2:
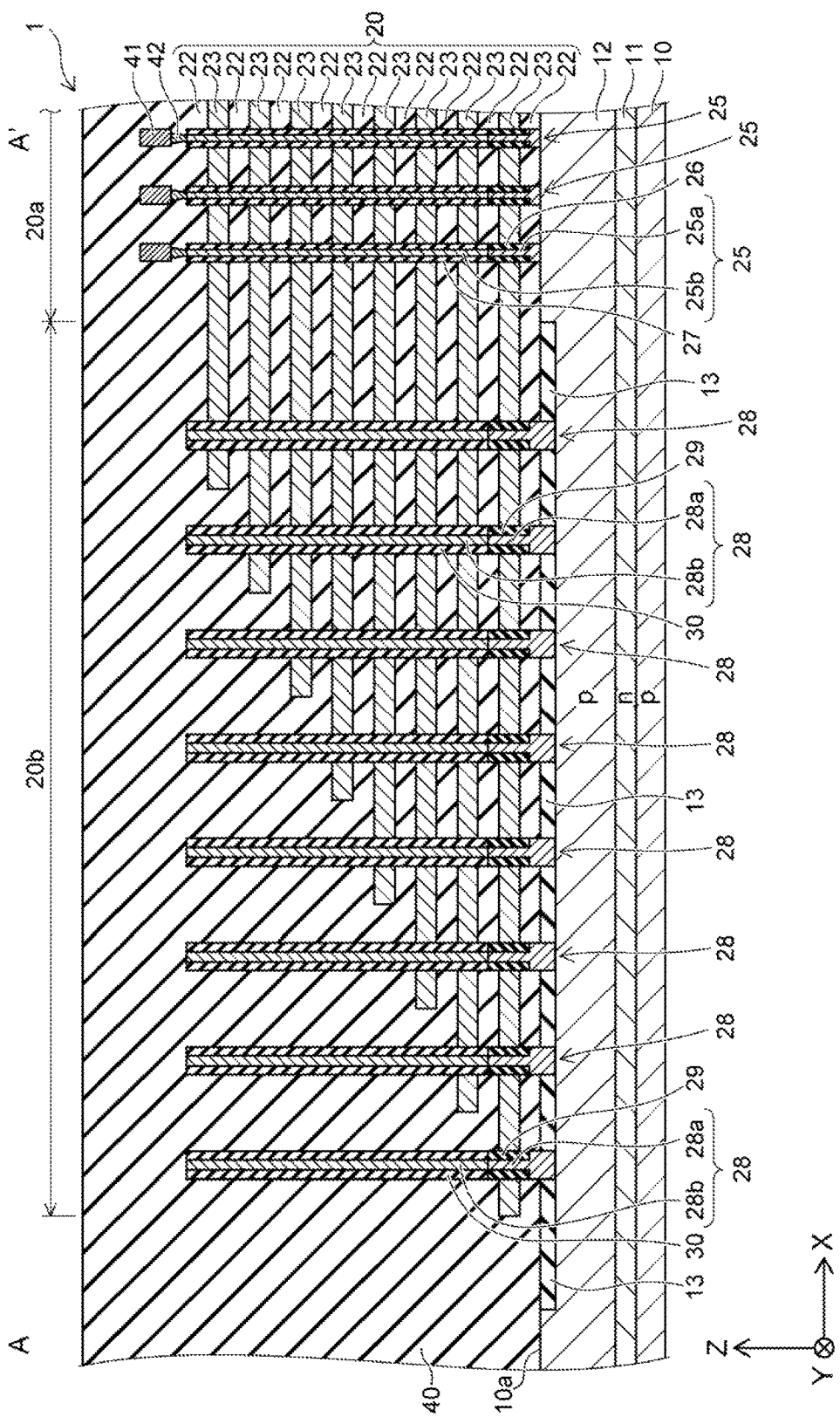
FIG. 2 is a cross-sectional view taken along line A-A' illustrated in FIG. 1.
Figure 3A:
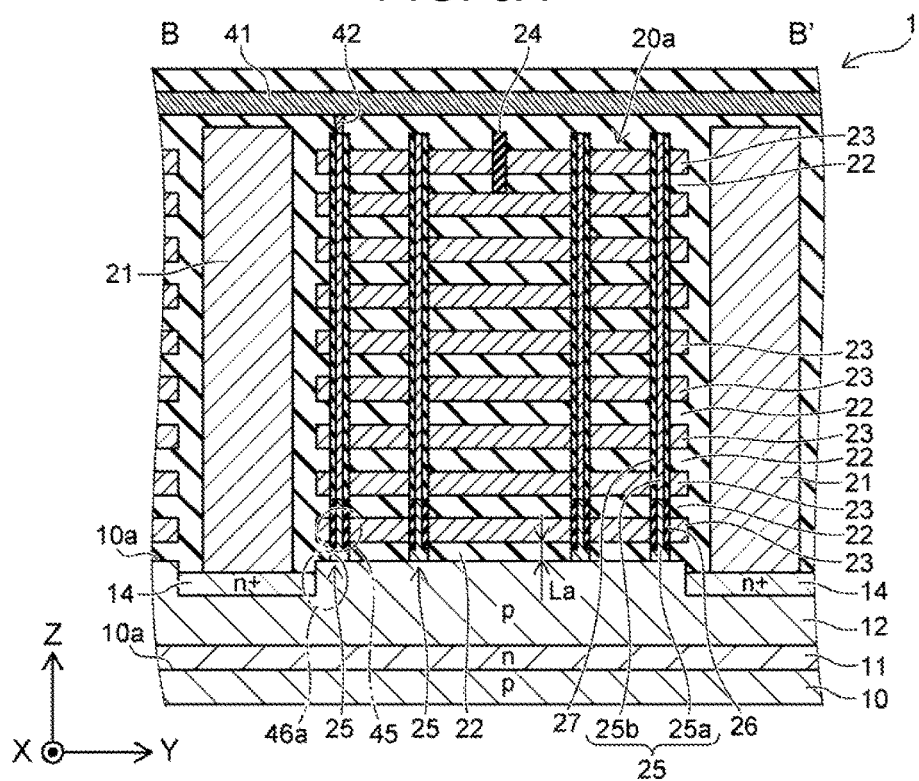
FIG. 3A is a cross-sectional view taken along line B-B' illustrated in FIG. 1.
Figure 3B:
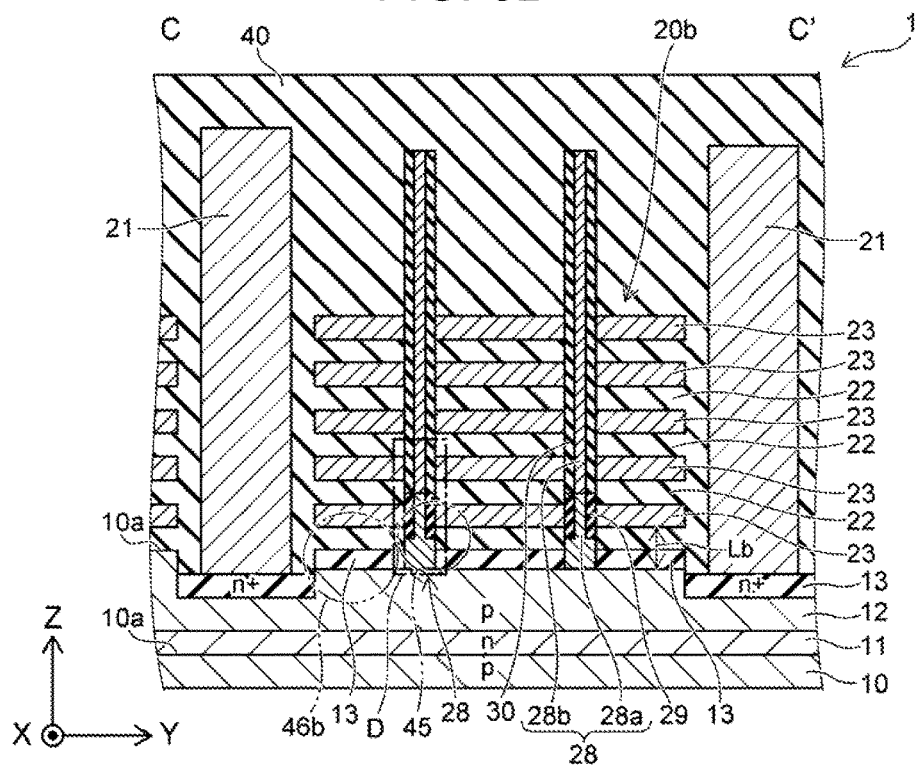
FIG. 3B is a cross-sectional view taken along line C-C' illustrated in FIG. 1.
Figure 4:
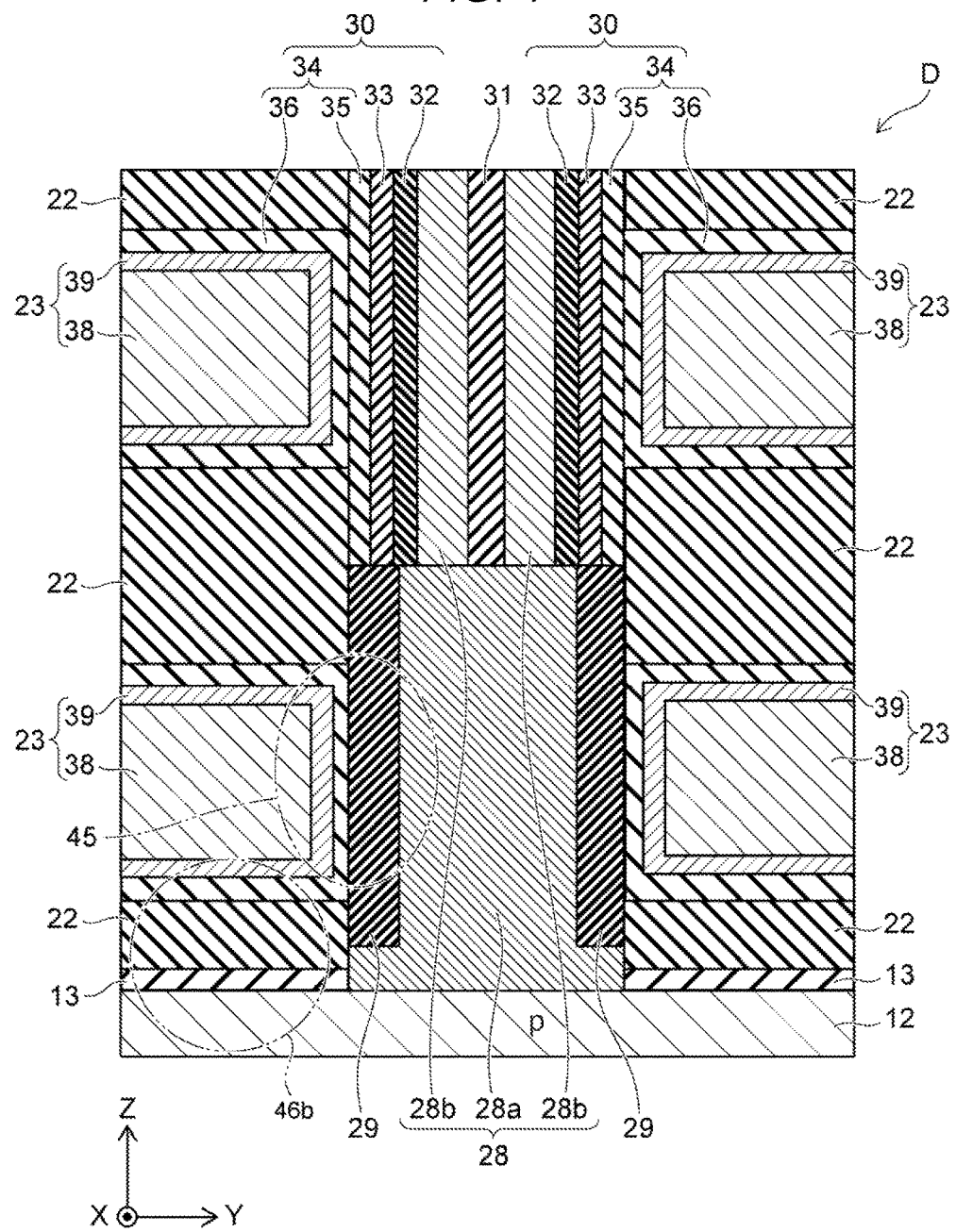
FIG. 4 is a cross-sectional view illustrating a region D in FIG. 3B.

FIG. 1 is a plan view illustrating a semiconductor memory device according to a first embodiment. FIG. 2 is a cross-sectional view taken along line A-A' illustrated in FIG. 1. FIG. 3A is a cross-sectional view taken along line B-B' illustrated in FIG. 1, and FIG. 3B is a cross-sectional view taken along line C-C' illustrated in FIG. 1. FIG. 4 is a cross-sectional view illustrating a region D in FIG. 3B.

It should be noted that the drawings are schematic. For example, each component may be drawn smaller or larger than an actual device or component size. In addition, the number of components, the dimensional ratio, and the like do not necessarily match between the drawings. This also applies to the drawings to be described below.

The semiconductor memory device according to the first embodiment is a stacked NAND flash memory, for example.

As illustrated in FIGS. 1 and 2, a semiconductor memory device 1 is provided with a silicon substrate 10 having p-type conductivity. The silicon substrate 10 is formed of, for example, single crystal silicon.

In the specification, an XYZ orthogonal coordinate system is adopted for convenience of description. Two directions parallel to an upper surface 10a of the silicon substrate 10 (see FIG. 2) and orthogonal to each other are taken as an "X direction" and a "Y direction", and a direction perpendicular to the upper surface 10a of the silicon substrate 10 is taken as a "Z direction". In the Z direction, a direction from the inside of the silicon substrate 10 toward the upper surface 10a is also referred to as an "up", and the opposite direction is referred to as a "down", but this differentiation is for convenience and is independent of the direction of gravity.

In the specification, a "silicon substrate" refers to a substrate containing silicon (Si) as a main component. This is also similar to other constituent components, and when the name of the constituent component includes a material name, then the component contains or comprises that material as a main component. In general, since silicon is a semiconductor material, unless otherwise specified, the silicon substrate is more generally described as a semiconductor substrate. This is also similar to other components, and in principle, the characteristic of the component reflects the characteristic of a main compositional component.

An n-well 11 having n-type conductivity is formed in a part of an upper layer of the silicon substrate 10, a p-well 12 having p-type conductivity is formed in a part of an upper layer of the n-well 11. The n-well 11 and the p-well 12 are parts of the silicon substrate 10. An insulating layer 13 is formed in a part of an upper layer of the p-well 12. The insulating layer 13 is formed of, for example, silicon oxide (SiO). For example, the upper layer of the silicon substrate 10 is thermally oxidized. An n+-type contact region 14 having n+-type conductivity is formed in another part of the upper layer of the p-well 12.

A plurality of stacked bodies 20 are provided on the p-well 12 and the insulating layer 13. Individual ones of the plurality of stacked bodies 20 are spaced from each other in the Y direction. A conductive plate 21 is provided between the stacked bodies 20. The conductive plate 21 has a plate shape extending along an XZ plane. The n+-type contact region 14 is formed in a region directly below the conductive plate 21 and is connected to a lower end of the conductive plate 21.

As illustrated in FIG. 2 and FIGS. 3A and 3B, a plurality of insulating films 22 and a plurality of electrode films 23 are alternately stacked one over the other as the stacked body 20. A center region, in the X direction, of the stacked body 20 is referred to as a cell portion 20a. The electrode films 23 are disposed on all the stages in the cell portion 20a. On the other hand, both end regions 20b of the stacked bodies 20 in the X direction have a staircase shape in which a terrace or step is not covered by an overlying layer of the stacked body 20 is provided for each electrode film 23. A silicon oxide member 24 extending in the X direction is provided at an upper center in the Y direction of the stacked body 20. The uppermost electrode film 23 is divided into two parts by the silicon oxidation member 24. Plural ones of the electrode films 23 starting from the top electrode film 23 may be divided into two parts by the silicon oxidation member 24.

A silicon pillar 25 made of, for example, an i-type (intrinsic) polysilicon is provided in the cell portion 20a of the stacked body 20. The silicon pillar 25 has substantially a cylindrical shape in which a lower portion 25a is closed. The lower portion 25a of the silicon pillar 25 is surrounded by the lowermost electrode film 23. A silicon oxide film 26 is provided on a side surface of the lower portion 25a. Apart excluding the lower portion 25a of the silicon pillar 25, that is, a part surrounded by the second or higher electrode films 23 from the bottom is referred to as an upper portion 25b. A core member 31 (see FIG. 4) made of, for example, silicon oxide is provided in the upper portion 25b. A memory film 27 is provided on a side surface of the upper portion 25b.

Silicon pillars 28 are made of, for example, an i-type (intrinsic) polysilicon are provided in the both ends 20b of the stacked body 20. The silicon pillar 28 has a larger diameter than the silicon pillar 25. The silicon pillar 28 has substantially a cylindrical shape in which a lower portion 28a is closed. The lower portion 28a is surrounded by the lowermost electrode film 23. A silicon oxide film 29 is provided on a side surface of the lower portion 28a. A part excluding the lower portion 28a of the silicon pillar 28, that is, a part surrounded by the second or higher electrode films 23 from the bottom is referred to as an upper portion 28b. The upper portion 28b has substantially the same thickness as the upper portion 25b of the silicon pillar 25. A core member 31 (see FIG. 4) made of, for example, silicon oxide is provided in the upper portion 28b. A memory film 30 is provided on a side surface of the upper portion 28b.

In the memory film 30, as illustrated in FIG. 4, a tunnel insulating film 32, a charge storage film 33, and a block insulating film 34 are provided in that order around the upper portion 28b of the silicon pillar 28. The tunnel insulating film 32 is usually an insulating film, but is a film through which a tunnel current flows when a predetermined voltage is applied within a range of a drive voltage of the semiconductor memory device 1. For example, the tunnel insulating film 32 is a single-layered silicon oxide film, or an ONO film in which a silicon oxide layer, a silicon nitride layer, and a silicon oxide layer are stacked in this order. The charge storage film 33 is a film capable of storing charges. For example, the charge storage film 33 is formed of a material including a trapping site of electrons, and is formed of silicon nitride (SiN), for example.

The block insulating film 34 is a film through which a current does not flow when a predetermined voltage is applied within the range of the drive voltage of the semiconductor memory device 1. In the embodiment, the block insulating film 34 is a double layered film of a silicon oxide layer 35 and an aluminum oxide layer 36. The tunnel insulating film 32, the charge storage film 33, and the silicon oxide layer 35 have a cylindrical shape which surrounds the upper portion 28b of the silicon pillar 28. The aluminum oxide layer 36 is provided on a lower surface, an upper surface, and side surfaces of the electrode film 23, the side surfaces facing the silicon pillars 25 and 28.

The memory film 27 has the same configuration as the memory film 30. The memory film 27 has substantially the same thickness as the memory film 30. However, the core member 31 disposed in the memory film 27 is thinner than the core member 31 disposed in the memory film 30. Accordingly, the memory film 27 has an inner diameter smaller than that of the memory film 30, and the memory film 27 also has an outer diameter smaller than that of the memory film 30.

On the electrode film 23, a main body 38 and a barrier metal layer 39 formed of, for example, tungsten (W) are provided. The barrier metal layer 39 is, for example, a double layered film in which a titanium (Ti) layer and a titanium nitride layer (TiN) are stacked, and is provided on an upper surface, a lower surface, and side surfaces of the main body 38, the side surfaces facing the silicon pillars 25 and 28.

As illustrated in FIG. 2, the insulating layer 13 is formed in a region directly below both end regions 20b of the stacked body 20, but it is not present in a region directly below the cell portion 20a. Between the silicon substrate 10 and the stacked body 20, the insulating layer 13 is disposed between the conductive plate 21 and the silicon pillar 28 and it is not disposed between the conductive plate 21 and the silicon pillar 25. For this reason, a distance Lb between the p-well 12 in the area between the conductive plate 21 and the silicon pillar 28 and the lowermost electrode film 23 (FIG. 3B), is longer than a distance La between the p-well 12 in the area between the conductive plate 21 and the silicon pillar 25 and the lowermost electrode film 23. That is, the relation of Lb>La is satisfied. In addition, when viewed from the Z direction, the silicon pillars 25 are disposed inwardly in the X direction from an inner edge of the insulating layer 13. A lower end of the silicon pillar 25 is connected to the p-well 12. On the other hand, when viewed from the Z direction, the silicon pillars 28 are disposed outwardly in the X direction from the inner edge of the insulating layer 13. A lower end of the silicon pillar 28 is connected to the p-well 12 by penetrating through the insulating layer 13.

In addition, an interlayer insulating film 40 formed of, for example, silicon oxide, is provided on an upper side and a lateral side of the stacked body 20 so as to cover the stacked body 20. On the stacked body 20, a bit line 41 extending in the Y direction is provided. The bit line 41 is connected to an upper end of the silicon pillar 25 via a plug 42. On the other hand, an upper end of the silicon pillar 28 is not connected to an additional conductor, and terminates isolated in the insulating film 40. Further, circuit elements such as CMOS are formed in the upper layer of the silicon substrate 10 and around the stacked body 20 in the interlayer insulating film 40, and constitute a peripheral circuit. Contacts (not illustrated) connected to the p-well 12 are provided around the stacked body 20 in the interlayer insulating film 40.

An operation of the semiconductor memory device according to the embodiment will be described below.

In the semiconductor memory device 1 according to the embodiment, a memory cell including MOSFET (Metal-Oxide-Semiconductor Field-Effect Transistor) is formed at every intersection between the silicon pillars 25 and the electrode films 23. Data is stored in these memory cells when a threshold voltage of the memory cell is switched to a storage value. On the other hand, the silicon pillar 28 functions as a pillar for the stacked body 20, and no memory cell is formed therein. A method of writing, reading, and erasing data to and from the memory cell will be described below.

In a write operation, a positive write potential is applied to the selected electrode film 23, a ground potential is applied to the selected silicon pillar 25 via the bit line 41, and thus electrons are injected from the silicon pillar 25 into the charge storage film 33 via the tunnel insulating film 32. As the electrons are stored in the charge storage film 33, a threshold voltage of the selected memory cell increases. In this manner, data is written in the selected memory cell.

In a read operation, as a positive ON potential is applied to the lowermost electrode film 23, a transistor 45 formed at an intersection between the lowermost electrode film 23 and the silicon pillar 25 and a transistor 46 formed between the lowermost electrode film 23 and the p-well 12 enter a conductive state, and a read potential is applied to the electrode film 23 of the memory cell to be read. Then, a voltage is applied between the bit line 41 and the conductive plate 21. Thus, a current flows from the bit line 41 to the conductive plate 21 via the plug 42, the silicon pillar 25, the p-well 12, and the n$^+$-type contact region 14. The magnitude of the current flowing at this time depends on the state of the memory to be read. Accordingly, the current flowing between the bit line 41 and the conductive plate 21 is detected, and thus the threshold voltage of the memory cell is determined. In this manner, data of the selected memory cell is read out.

At this time, the insulating layer 13 is interposed between the p-well 12 and the lowermost electrode film 23 in the region directly below both ends 20b of the stacked body 20, but the insulating layer 13 is not interposed in the region directly below the cell portion 20a. For this reason, among the transistors 46 formed between the lowermost electrode film 23 and the p-well 12, the threshold voltage Vth_46b of a transistor 46b formed in the region directly below both end regions 20b is higher than the threshold voltage Vth_46a of a transistor 46a formed in the region directly below the cell portion 20a. For example, the threshold voltage Vth_46b of the transistor 46b is higher than the threshold voltage Vth_45 of the transistor 45, and the threshold voltage Vth_46a of the transistor 46a is lower than the threshold voltage Vth_45 of the transistor 45. That is, the relation of Vth_46b>Vth_45>Vth_46a is satisfied. Therefore, when the ON potential is applied to the lowermost electrode film 23, the degree of conduction of the transistor 46b is lower than the degree of conduction of the transistor 46a. For this reason, the potential applied to the conductive plate 21 is hardly transmitted to the silicon pillar 28.

In an erasing operation, a ground potential is applied to all the electrode films 23 belonging to one stacked body 20, and from contacts (not illustrated) disposed around the stacked body 20, a positive erasing potential is applied to the silicon pillar 25 via the p-well 12. Thus, the electrons stored in the charge storage film 33 are extracted to the silicon pillar 25 via the tunnel insulating film 32. As a result, the electrons stored in the charge storage film 33 are eliminated, and the threshold voltage of the memory cell lowers. In this manner, data of all the memory cells belonging to a certain stacked body 20 is erased collectively.

A method of forming the insulating layer 13 of the embodiment will be described below.

FIGS. 5A to 5D are cross-sectional views illustrating the method of forming the insulating layer 13 of the embodiment.

Figure 5A:
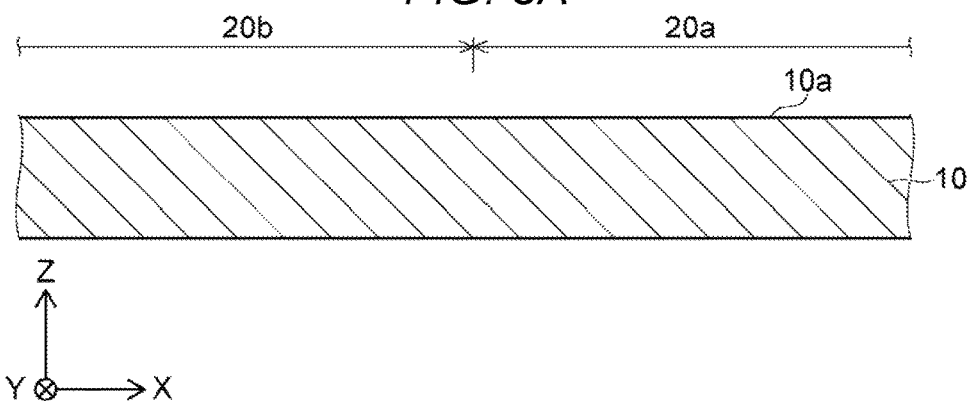
FIGS. 5A to 5D are cross-sectional views illustrating a method of forming an insulating layer of the first embodiment.

First, as illustrated in FIG. 5A, a silicon substrate 10 is prepared.

Figure 5B:
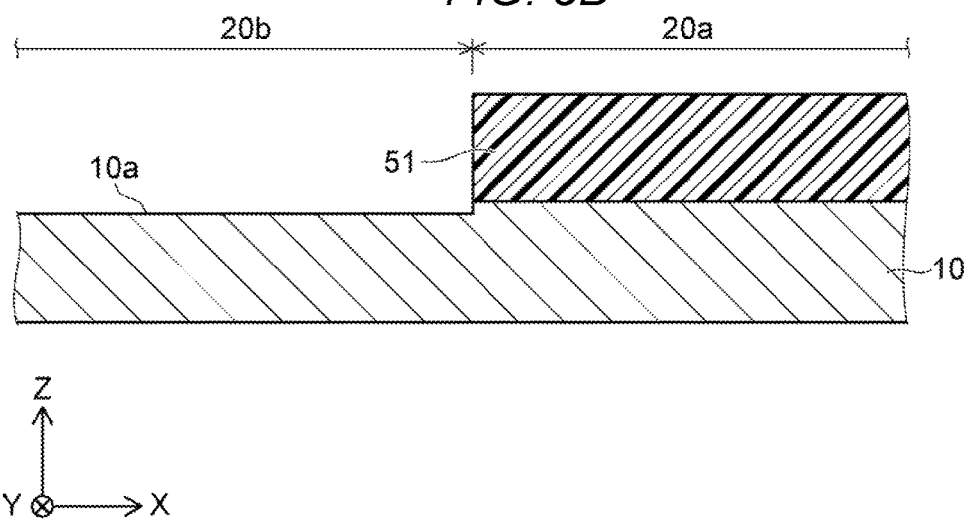

Next, as illustrated in FIG. 5B, a resist mask 51 is formed in a region on the silicon substrate 10 excluding a region where both end regions 20b are to be formed. Subsequently, the upper surface 10a of the silicon substrate 10 is subjected to etching such as reactive ion etching (RIE) using the resist mask 51 as a mask. Thus, the region on the upper surface 10a of the silicon substrate 10 where both end regions 20b are to be formed is etched back and is lower than a region where the cell portion 20a is to be formed. Next, the resist mask 51 is removed.

Figure 5C:
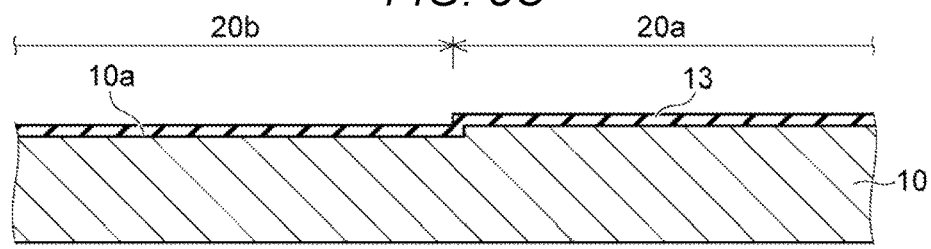

Next, as illustrated in FIG. 5C, heat treatment is performed in an oxidizing atmosphere. Thus, the upper layer of the silicon substrate 10 is thermally oxidized, and the insulating layer 13 of silicon oxide is formed.

Figure 5D:
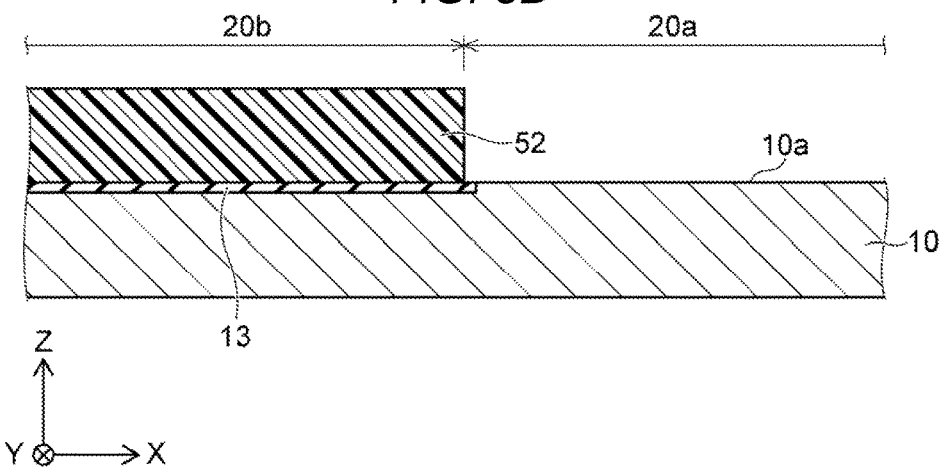

Next, as illustrated in FIG. 5D, a resist mask 52 is formed in a region on the silicon substrate 10 where both ends 20b are to be formed. Subsequently, the silicon oxide is subjected to wet etching using the resist mask 52 as a mask. Next, the resist mask 52 is removed.

Thus, the insulating layer 13 is removed in a region excluding the region where both ends 20b are to be formed. As a result, the insulating layer 13 remains only in the region where both end regions 20b are to be formed. At this time, a position of the upper surface 10a of the silicon substrate 10 in the cell portion 20a is substantially equal to, in the Z direction, a position of an upper surface of the insulating layer 13 in both end regions 20b.

In this manner, the insulating layer 13 is formed. Thereafter, an n-well 11 and a p-well 12 are formed by ion implantation. After the n-well 11 and the p-well 12 are formed, the insulating layer 13 may be formed.

Effects of the first embodiment will be described.

In the semiconductor memory device 1 according to the first embodiment, since the insulating layer 13 is provided in the region directly below both end regions 20b of the stacked body 20, the threshold voltage Vth_46b of the transistor 46b is higher than the threshold voltage Vth_46a of the transistor 46a. Thus, even when an ON potential is applied to the lowermost electrode film 23 in the read operation, the transistor 46b does not sufficiently go into a conductive state, and the potential applied to the conductive plate 21 is not substantially transmitted to the silicon pillar 28. For this reason, a high voltage is not substantially applied between the silicon pillar 28 and the electrode film 23, and the memory film 30 is not damaged. As a result, the semiconductor memory device according to the first embodiment has high reliability.

In contrast, if the insulating layer 13 is not provided, the transistor 46b goes into a conductive state in the read operation, and the potential applied to the conductive plate 21 is applied to the silicon pillar 28 without reduction. As described above, the diameter of the silicon pillar 28 is larger than that of the silicon pillar 25, but the silicon pillar 28 is formed in the same process as the silicon pillar 25. Since conditions of this process are optimized for the silicon pillar constituting the memory cell, the silicon pillar 28 generally has a shape accuracy less than that of the silicon pillar 25. As a result, the shape of the silicon pillar 28 tends to be irregular, and a thickness of the memory film 30 also thus tends to be non-uniform. For this reason, when a potential is repeatedly applied to the memory film 30, electric field concentration occurs and the memory film 30 may be broken. For this reason, the reliability of the semiconductor memory device is lowered.

In the first embodiment, the position of the upper surface 10a of the silicon substrate 10 in the cell portion 20a is substantially equal to, in the Z direction, the position of the upper surface of the insulating layer 13 in both end regions 20b. Therefore, it is possible to prevent formation of a step on the electrode film 23 and the like at an interface between the cell portion 20a and both end regions 20b. As a result, the semiconductor memory device 1 has high shape accuracy and high reliability.

Furthermore, the insulating layer 13 may be formed using a thermal oxidation process for forming a peripheral circuit. For this reason, it is not necessary to provide an additional process for forming the insulating layer 13.

Second Embodiment

Figure 6A:
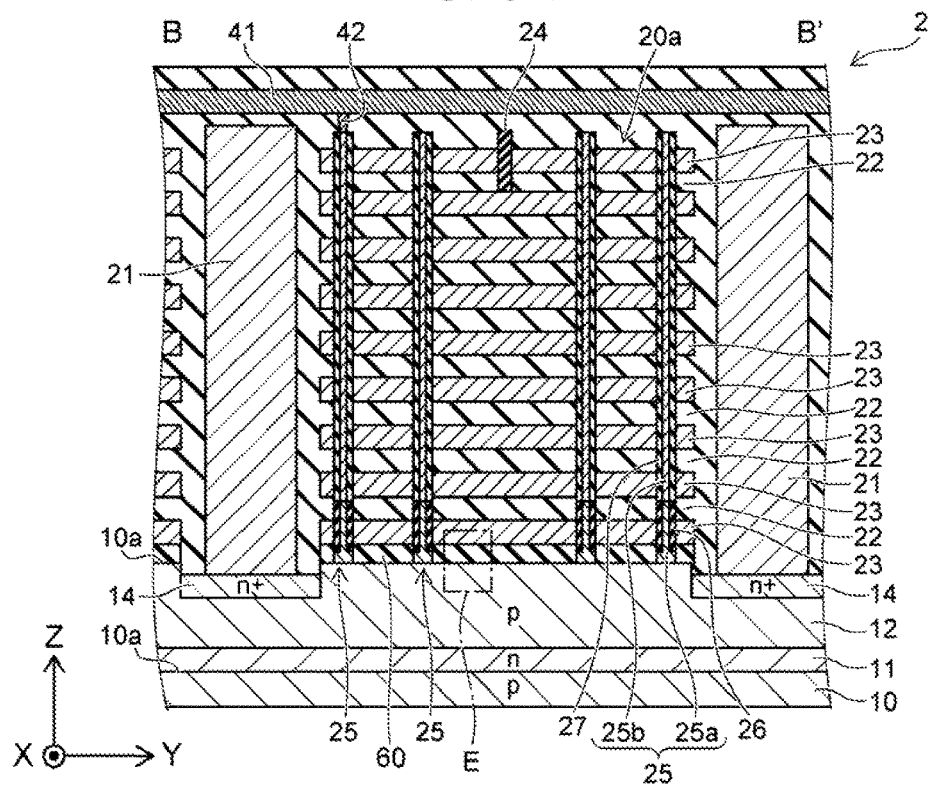
FIGS. 6A and 6B are cross-sectional views illustrating a semiconductor memory device according to a second embodiment, with FIG. 6A illustrating a cell portion of a stacked body and FIG. 6B illustrating an end portion of the stacked body.
Figure 6B:
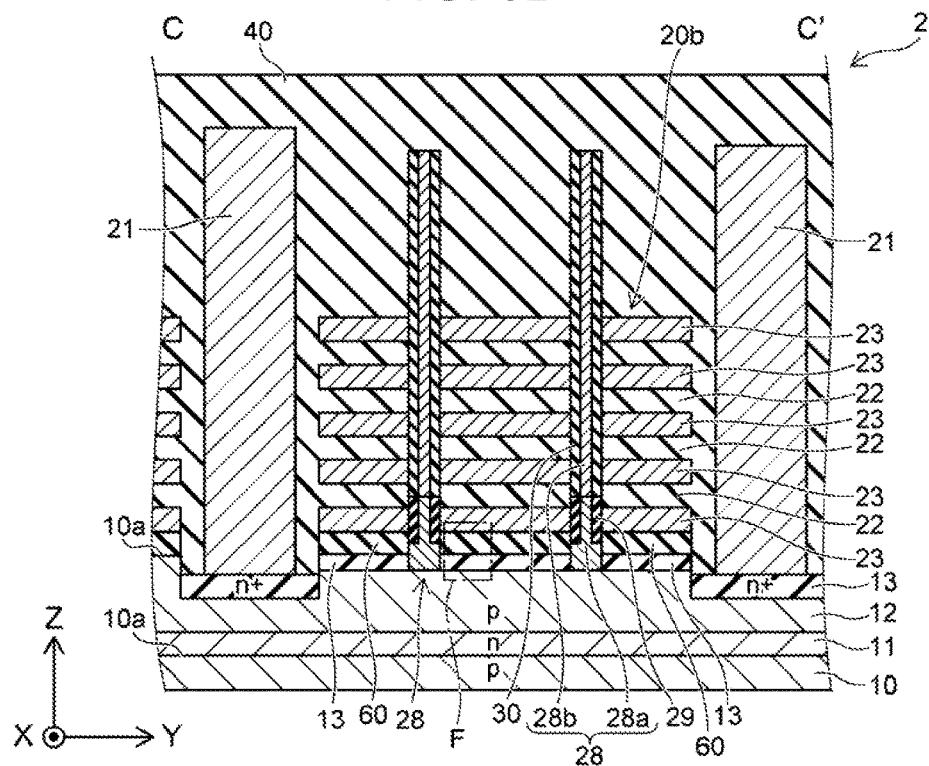

FIGS. 6A and 6B are cross-sectional views illustrating the semiconductor memory device according to a second embodiment, wherein FIG. 6A illustrates a cell portion of a stacked body and FIG. 6B illustrates an end portion of the stacked body.

A cross section illustrated in FIG. 6A corresponds to the cross section taken along line B-B' illustrated in FIG. 1, and a cross section illustrated in FIG. 6B corresponds to the cross section taken along line C-C' illustrated in FIG. 1.

Figure 7A:
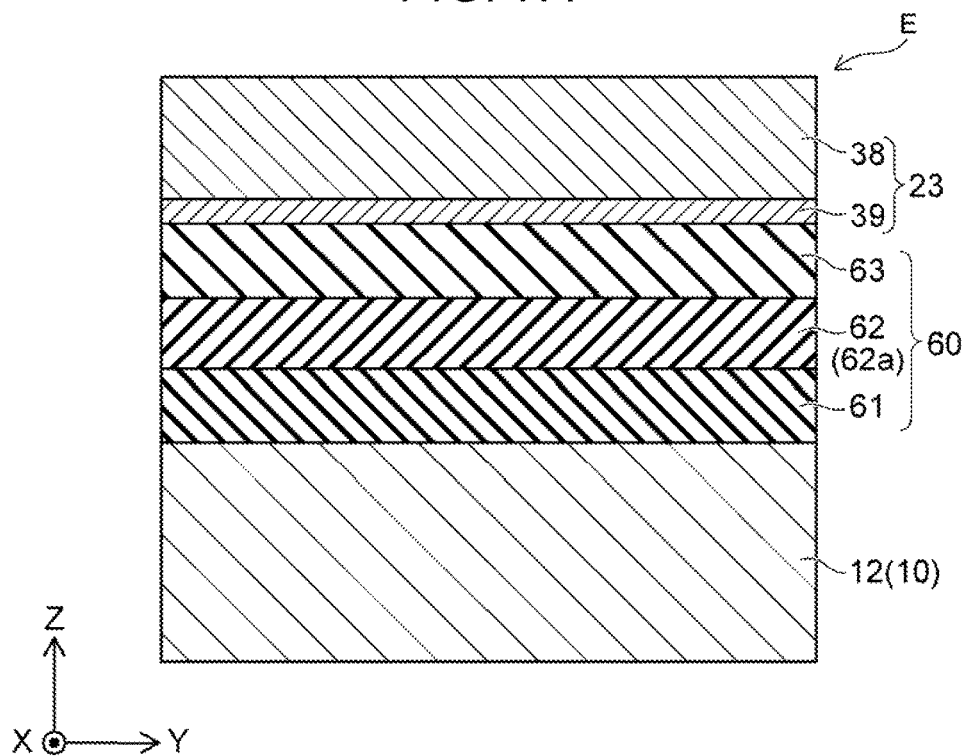
FIG. 7A is a cross-sectional view illustrating a region E in FIG. 6A.
Figure 7B:
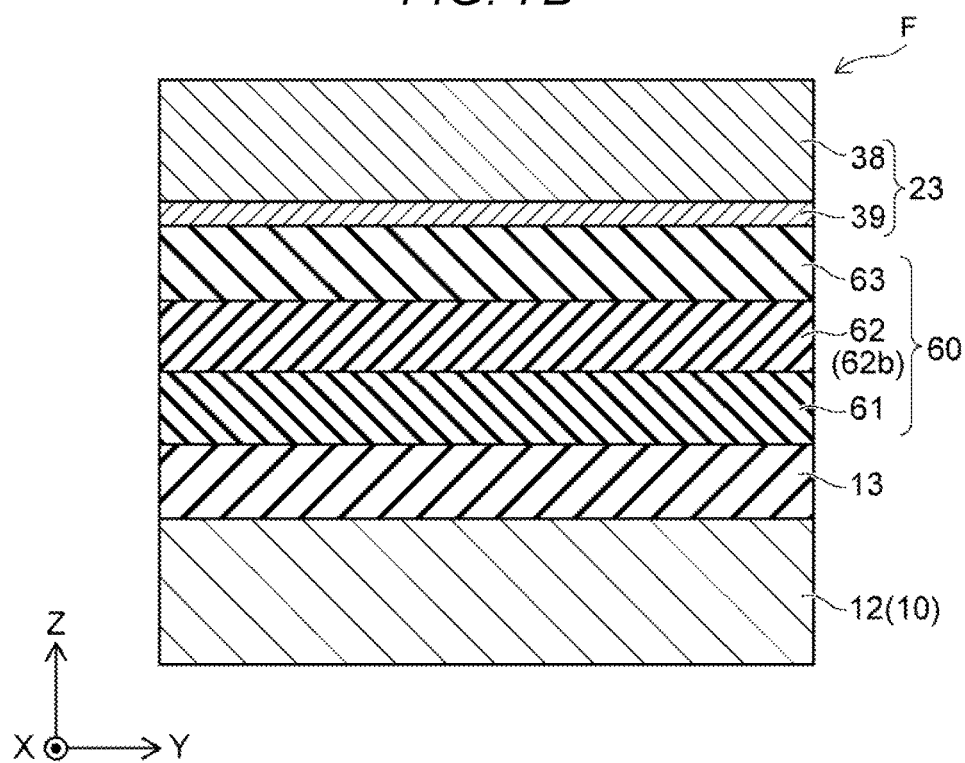
FIG. 7B is a cross-sectional view illustrating a region F in FIG. 6B.

FIG. 7A is a cross-sectional view illustrating a region E in FIG. 6A, and FIG. 7B is a cross-sectional view illustrating a region F in FIG. 6B.

In a semiconductor memory device 2, as illustrated in FIGS. 6A and 6B, instead of the insulating film 22, a charge storage film 60 is provided between the silicon substrate 10 and the lowermost electrode film 23. The charge storage film 60 is provided at both a cell portion 20a and both end regions 20b. At both end regions 20b, the charge storage film 60 is disposed between the insulating layer 13 and the lowermost electrode film 23.

As illustrated in FIGS. 7A and 7B, a silicon oxide layer 61, a silicon nitride layer 62, and a silicon oxide layer 63 are stacked in this order from the bottom to the top in the charge storage film 60. The silicon nitride layer 62 can stores charges, for example, electrons. The silicon oxide layers 61 and 63 prevent leakage of the electrons stored in the silicon nitride layer 62. The amount of electrons contained in a portion 62b of the silicon nitride layer 62 disposed at both end portions 20b is larger than that of electrons contained in a portion 62a of the silicon nitride layer 62 disposed at the cell portion 20a.

When the semiconductor memory device 2 is manufactured, electrons are naturally stored in the silicon nitride layer 62. Then, after completion of the semiconductor memory device 2, an erasing operation is performed to remove the electrons from the portion 62a of the silicon nitride layer 62 disposed at the cell portion 20a. Thus, the amount of electrons contained in the portion 62b is larger than the amount of electrons contained in the portion 62a.

An operation of the semiconductor memory device according to the second embodiment will be described below.

In the semiconductor memory device 2 according to the second embodiment, the amount of electrons contained in the portion 62b of the silicon nitride layer 62 is larger than the amount of electrons contained in the portion 62a. In addition, since the insulating layer 13 is provided in the region directly below both end portions 20b, the distance between the p-well 12 and the lowermost electrode film 23 is longer compared to the distance in the region directly below the cell portion 20a. For this reason, among the transistors 46 formed between the lowermost electrode film 23 and the p-well 12, the threshold voltage $Vth\_46b$ of the transistor 46b formed in the region directly below both end portions 20b of the stacked body 20 is higher than the threshold voltage $Vth\_46a$ of the transistor 46a formed in the region directly below the cell portion 20a. For example, the threshold voltage $Vth\_46b$ is higher than the threshold voltage $Vth\_45$ of the transistor 45, and the threshold voltage $Vth\_46a$ is lower than the threshold voltage $Vth\_45$. Therefore, when the ON potential is applied to the lowermost electrode film 23 in the read operation, the degree of conduction of the transistor 46b is lower than the degree of conduction of the transistor 46a.

According to the second embodiment, the transistor 46a sufficiently goes into a conductive state in the read operation to perform the read operation on the memory cell. On the other hand, the transistor 46b does not substantially go into the conductive state, and the potential applied to the conductive plate 21 can be prevented from being applied to the silicon pillar 28. As a result, a high voltage can be prevented from being applied to the memory film 30 accompanying the read operation. Thus, the damage of the memory film 30 can be prevented, and thus the reliability of the semiconductor memory device 2 can be enhanced.

Configurations, operations, and effects other than those described above in the second embodiment are otherwise substantially the same as those in the first embodiment.

In the charge storage film 60, a hafnium oxide layer (HfO) or a zirconium oxide layer (ZrO) may be provided instead of the silicon nitride layer 62.

According to the above-described example embodiments, a semiconductor memory device having high reliability can be achieved.

While certain embodiments have been described, these embodiments have been presented by way of example only, and are not intended to limit the scope of the present disclosure. Indeed, the novel embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:
1. A semiconductor memory device, comprising:
   a semiconductor substrate;
   a stacked body including a plurality of electrode films stacked on the semiconductor substrate and spaced from one another in a first direction, an end portion of the stacked body in a second direction intersecting the first direction has a staircase shape;

a conductive member extending in the first direction and adjacent to the stacked body in the second direction, the conductive member being connected to the semiconductor substrate;

a first semiconductor pillar connected to the semiconductor substrate and extending in the first direction through a central portion of the stacked body adjacent to the end portion in the second direction;

a second semiconductor pillar connected to the semiconductor substrate and extending in the first direction through the end portion of the stacked body;

a charge storage member between the first semiconductor pillar and the electrode films;

an insulating member between the second semiconductor pillar and at least one electrode film in the end portion of the stacked body; and an insulating layer between the semiconductor substrate and the end portion of the stacked body and extending into a region of the end portion between the conductive member and the second semiconductor pillar.

2. The semiconductor memory device according to claim 1, wherein the insulating layer is not formed between the main portion of the stacked body and the semiconductor substrate.

3. The semiconductor memory device according to claim 2, wherein the semiconductor substrate further comprises:

a first surface extending in the second direction and a third direction intersecting the first and second directions, over which the main portion of the stacked body is located, and a second surface extending in the second and third directions, over which the end portion of the stacked body is located, wherein the second surface is recessed inwardly of the first surface of the semiconductor substrate.

4. The semiconductor memory device according to claim 3, wherein the recess depth of the second surface from the first surface is equal to the thickness of the insulating layer.

5. The semiconductor memory device according to claim 1, further comprising:

a charge storage layer extending continuously under the main portion and end portion of the stacked body.

6. The semiconductor memory device according to claim 5, further comprising:

a first insulating layer; and
a second insulating layer, wherein
the charge storage layer is located between the first insulating layer and the second insulating layer.

7. The semiconductor memory device according to claim 1, wherein the width, in the second direction, of the first semiconductor pillar is greater than the width, in the second direction, of the second semiconductor pillar.

8. A semiconductor memory device, comprising:
a semiconductor substrate;
a stacked body located over a first region of the semiconductor substrate, the stacked body including a plurality of electrode films spaced from one another in a first direction orthogonal to the substrate, an end portion of the stacked body being located to a side of a main portion of the stacked body in a second direction intersecting the first direction and having a staircase shape;

a conductive member extending in the first direction and connected to the semiconductor substrate, the conductive member being adjacent to the stacked body in the second direction;

a first semiconductor pillar connected to the semiconductor substrate and extending in the first direction through a portion of the main portion of the stacked body;

a second semiconductor pillar connected to the semiconductor substrate and extending in the first direction through the end portion of the stacked body;

a charge storage member between the first semiconductor pillar and the electrode films in the main portion of the stacked body;

an insulating member between the second semiconductor pillar and at least one electrode film in the end portion of the stacked body; and an insulating layer between the semiconductor substrate and the stacked body and extending into a region between the conductive member and the second semiconductor pillar, wherein the distance between the semiconductor substrate and the electrode film closest to the semiconductor substrate in the main portion is less than the distance between the semiconductor substrate and the electrode film closest to the semiconductor substrate in the end portion.

9. The semiconductor memory device according to claim 8, wherein the insulating layer is not formed between the main portion of the stacked body and the semiconductor substrate.

10. The semiconductor memory device according to claim 9, wherein the semiconductor substrate further comprises:

a first surface extending in the second direction and a third direction intersecting the first and second directions, over which the main portion of the stacked body is located, and a second surface extending in the second and third directions, over which the end portion of the stacked body is located, and the second surface is recessed inwardly of the first surface of the semiconductor substrate.

11. The semiconductor memory device according to claim 10, wherein the recess depth of the second surface from the first surface is equal to the thickness of the insulating layer.

12. The semiconductor memory device according to claim 8, further comprising:

a charge storage layer extending continuously under the main portion and end portion of the stacked body.

13. The semiconductor memory device according to claim 12, further comprising:

a first insulating layer; and
a second insulating layer, wherein
the charge storage layer is located between the first insulating layer and the second insulating layer.

14. The semiconductor memory device according to claim 8, wherein the width, in the second direction, of the first semiconductor pillar is greater than the width, in the second direction, of the second semiconductor pillar.

15. A semiconductor memory device, comprising:
a semiconductor substrate;
a stacked body located over a first region of the semiconductor substrate, the stacked body including a plurality of electrode films spaced from one another in a first direction orthogonal to the surface of the substrate, an end portion of the stacked body adjacent to a main portion of the stacked body in a second direction intersecting with the first direction has a staircase shape;

a conductive member extending in the first direction and adjacent to the stacked body in the second direction and connected to the semiconductor substrate;

a first semiconductor pillar connected to the semiconductor substrate and extending in the first direction through a portion of the main portion of the stacked body;

a second semiconductor pillar connected to the semiconductor substrate and extending in the first direction through the end portion of the stacked body;

a charge storage member between the first semiconductor pillar and the electrode films;

an insulating member between the second semiconductor pillars and at least one electrode film in the end portion of the stacked body;

an insulating layer between the semiconductor substrate and the stacked body at the end portion and extending into a region between the conductive member and the second semiconductor pillar; and a charge storage layer between the semiconductor substrate and the stacked body in the main portion.

16. The semiconductor memory device according to claim 15, wherein the insulating layer is not formed between the main portion of the stacked body and the semiconductor substrate.

17. The semiconductor memory according to claim 16, wherein the semiconductor substrate further comprises:

a first surface extending in the second direction and a third direction intersecting the first and second directions, over which the main portion of the stacked body is located, and a second surface extending in the second and third directions, over which the end portion of the stacked body is located, and the second surface is recessed inwardly of the first surface of the semiconductor substrate.

18. The semiconductor memory device according to claim 17, wherein the recess depth of the second surface from the first surface is equal to the thickness of the insulating layer.

19. The semiconductor memory device according to claim 15, wherein the charge storage layer extends continuously between the main portion and end portion of the stacked body and the semiconductor substrate.

20. The semiconductor memory device according to claim 15, further comprising:

a first insulating layer; and a second insulating layer, wherein the charge storage layer is located between the first insulating layer and the second insulating layer.

* * * * *